United States Patent
Chen et al.

(10) Patent No.: US 7,632,694 B2
(45) Date of Patent: Dec. 15, 2009

(54) MANUFACTURING METHOD FOR A TFT ELECTRODE FOR PREVENTING METAL LAYER DIFFUSION

(75) Inventors: Cheng-Chung Chen, I Lan Hsien (TW); Yu-Chang Sun, Hsintien (TW); Yi-Hsun Huang, Hsin Chu (TW); Chien-Wei Wu, Chu Pei (TW); Shuo-Wei Liang, Pan Chiao (TW); Chia-Hsiang Chen, Tai Nan Hsien (TW); Chi-Shen Lee, Hsin Chu (TW); Chai-Yuan Sheu, Tai Nan Hsien (TW); Yu-Chi Lee, Taipei (TW); Te-Ming Chu, Tao Yuan Hsien (TW); Cheng-Hsing Chen, Tao Yuan (TW)

(73) Assignees: Taiwan TFT LCD Association, Hsinchu (TW); Chunghwa Picture Tubes, Ltd., Taoyuan (TW); AU Optronics Corp., Hsinchu (TW); Quanta Display Inc., Tao Yuan Shien (TW); Hannstar Display Corp., Taipei (TW); Chi Mei Optoelectronics Corp., Tainan County (TW); Industrial Technology Research Institute, Hsinchu (TW); Toppoly Optoelectronics Corp., Miao-Li County (TW)

( * ) Notice: Subject to any disclaimer, the term of this patent is extended or adjusted under 35 U.S.C. 154(b) by 61 days.

(21) Appl. No.: 11/375,336

(22) Filed: Mar. 15, 2006

(65) Prior Publication Data

US 2006/0202203 A1    Sep. 14, 2006

Related U.S. Application Data

(62) Division of application No. 10/964,611, filed on Oct. 15, 2004, now Pat. No. 7,045,817.

(30) Foreign Application Priority Data

Jun. 15, 2004    (TW) ............................... 93117216 A

(51) Int. Cl.
*H01L 21/00* (2006.01)
(52) U.S. Cl. .................................. 438/30; 257/E21.414
(58) Field of Classification Search ................. 438/149, 438/FOR. 201, FOR. 184, 30, 151, 159; 345/92; 257/223, 227, 291, 292, 439, 655, E27.1, 257/E27.125, E27.112, E29.117, E29.145, 257/E29.147, E29.182, E29.273–E29.299, 257/E29.314, E29.32, E23.016, 59, E51.005, 257/E21.414
See application file for complete search history.

(56) References Cited

U.S. PATENT DOCUMENTS 5,650,358 A * 7/1997 Gu et al. ....................... 438/30

(Continued)

FOREIGN PATENT DOCUMENTS

JP             61226731 A   * 10/1986

*Primary Examiner*—W. David Coleman
*Assistant Examiner*—Latanya Crawford
(74) *Attorney, Agent, or Firm*—Rabin & Berdo, P.C.

(57) ABSTRACT

A manufacturing method for a TFT electrode which is implemented to prevent metal ion diffusion to an adjacent insulating layer during fabrication. The method includes, in the order recited, providing a substrate; forming a first metal layer on the substrate which is comprised of one of a single metal layer structure or a multiple metal layer structure; performing a photolithography and etching process on the first metal layer to form a gate electrode of the TFT electrode; forming a transparent conducting electrode on the first metal layer to cover at least the gate electrode and prevent metal ion diffusion during fabrication, the transparent conducting electrode being comprised of one of indium tin oxide, indium zinc oxide, ZnO or an organic material; and forming a pixel electrode which functions as a barrier to prevent metal ion diffusion during fabrication by performing a photolithography and etching process on the transparent conducting electrode.

6 Claims, 7 Drawing Sheets

U.S. PATENT DOCUMENTS

| | | | |
|---|---|---|---|
| 5,838,037 A | 11/1998 | Masutani et al. | |
| 5,969,377 A * | 10/1999 | Seo | 257/72 |
| 6,008,869 A * | 12/1999 | Oana et al. | 349/43 |
| 6,218,221 B1 * | 4/2001 | Sah | 438/158 |
| 6,323,068 B1 * | 11/2001 | Seo | 438/154 |
| 6,674,502 B1 * | 1/2004 | Terakado et al. | 349/147 |
| 6,791,111 B2 * | 9/2004 | Yamazaki et al. | 257/57 |
| 6,800,510 B2 * | 10/2004 | Peng et al. | 438/149 |
| 6,864,937 B2 * | 3/2005 | Moon et al. | 349/139 |
| 6,953,715 B2 * | 10/2005 | Peng et al. | 438/149 |
| 7,045,817 B2 * | 5/2006 | Chen et al. | 257/59 |
| 2003/0007107 A1 * | 1/2003 | Chae et al. | 349/43 |
| 2003/0134458 A1 * | 7/2003 | Shih | 438/149 |
| 2003/0170926 A1 * | 9/2003 | Nakayama et al. | 438/30 |
| 2004/0063374 A1 * | 4/2004 | So et al. | 445/24 |
| 2004/0140566 A1 * | 7/2004 | Jeong et al. | 257/764 |
| 2004/0223090 A1 * | 11/2004 | Takahashi et al. | 349/38 |
| 2005/0082528 A1 * | 4/2005 | Kobayashi et al. | 257/57 |
| 2007/0182905 A1 * | 8/2007 | Kaneko et al. | 349/141 |

* cited by examiner

MANUFACTURING METHOD FOR A TFT ELECTRODE FOR PREVENTING METAL LAYER DIFFUSION

CROSS-REFERENCE TO RELATED APPLICATION

This application is a divisional of prior application Ser. No. 10/964,611, filed Oct. 15, 2004 now U.S. Pat. No. 7,045,817.

BACKGROUND OF THE INVENTION

1. Field of the Invention

The invention relates to a TFT electrode structure and its manufacturing method that can prevent metal diffusion to an adjacent dielectric layer during the fabrication of the TFT.

2. Description of the Related Art

FIG. 1A~1C show a TFT structure and its manufacturing method as disclosed in U.S. Pat. No. 6,218,221. The shown TFT structure has a multi-metal structure. As shown in FIG. 1A, a glass substrate 10 is used as a transparent insulating substrate. A conductive layer made of metal or a metallic alloy is formed on the glass substrate 10, and is etched to form a gate electrode 11 of the TFT, wherein the TFT is a multi-gate TFT structure. A dielectric layer 12 is formed over the glass substrate 10 and the gate electrode 11, and is used as insulating layer of the gate electrode 11. The dielectric layer 12 can be made of silicon oxide, silicon nitride, or a multi-layer combination of silicon oxide and silicon nitride. A semiconductor layer 13 made of amorphous silicon layer is formed on the dielectric layer 12, and an N+ doped amorphous silicon layer 14 is formed on the semiconductor layer 13.

As shown in FIG. 1B, a multi-metal structure 15 then is formed over the N+ amorphous silicon layer 14 and the dielectric layer 12. Each layer of the multi-metal structure 15 has a different etching resistance, the lower layer of greater etching resistance is used to prevent undesirable etching of the lower layer structure when the upper layer is etched.

FIGS. 1C and 1D respectively show the structure of FIGS. 1A and 1B being processed using a photo-mask 61, and different etching methods, to form desired patterned structures according to the actual demand.

Lastly, a passivation layer 17 is formed on the above structure by chemical vapor deposition, to isolate and protect the underlying layer structure. The passivation layer 17 can be made of silicon oxide or silicon nitride. A transparent conducting electrode 18 then is formed as pixel electrode by sputtering and a photo-mask method.

In the above method, a conductive layer 11 is formed on the glass substrate 10, and the deposition method used to form the dielectric layer 12 on the conductive layer 11 is performed under high temperature, which causes metal diffusion of the conductive layer 11. As a result, current leakage can occur through the dielectric layer 12.

FIG. 2A~2E are schematic views illustrating a manufacturing method of a TFT array as disclosed in U.S. Pat. No. 5,838,037. In an embodiment of the U.S. Pat. No. 5,838,037 of a 3-electrode TFT structure, a gate electrode 22, a pixel electrode 23, and a counter electrode 24 as protective element are formed on substrate 21.

As shown in FIG. 2B, an insulating layer 25 is formed on the above 3 electrodes. A first amorphous silicon layer 26 and second amorphous silicon layer 27 are respectively formed and etched to have an adequate shape at a location above the gate electrode 22.

As shown in FIG. 2C, a contact hole 28 is etched through the insulating layer 25, so that the pixel electrode 23 electrically connects to the overlying electrode. As shown in FIG. 2D, source 29 and drain 30 are formed on the etched insulating layer 25 and amorphous silicon layers 26, 27, the pixel electrode 23 connecting to the drain 30. As shown in FIG. 2E, a passivation layer 31 is lastly formed as protective layer of the TFT.

Because the chemical vapor deposition used so far in the TFT manufacturing method is a high-temperature process, metallic ion can easily diffuse to the adjacent dielectric layer or other insulating layers. As a result, the manufacturing process is contaminated, which affects the TFT characteristics. Furthermore, the chemical vapor depositing machine can be affected by the environment, and the film quality formed can be easily affected by previously formed films.

In the conventional process, regardless of whether the transparent conducting electrode and the gate electrode are formed on or below the active layer, the dielectric layer or other insulating structures are usually formed by chemical vapor deposition after the gate formation is completed, which easily causes contamination of the chemical vapor depositing machine due to metallic ion diffusion.

The invention provides a method that can prevent metal diffusion and reduce the risk of metallic ion contamination in the chemical vapor deposition process. In the invention, the transparent pixel electrode is formed after the gate electrode metal so that the pixel transparent electrode can be used as a metallic ion barrier layer to prevent metal diffusion under high temperature from the gate electrode metal to adjacent insulating layers or the active layer. Further, the method used to form the transparent pixel electrode is physical vapor deposition process, which is affected less by the processing environment, and the transparent pixel electrode further is a conductive layer that is not affected by metal diffusion.

SUMMARY OF THE INVENTION

The invention provides a method that can prevent metal diffusion and reduce the risk of metallic ion contamination in the chemical vapor deposition process. In the invention, the transparent pixel electrode is formed after the gate electrode metal so that the pixel transparent electrode can be used as a metallic ion barrier layer to prevent metal diffusion under high temperature from the gate electrode metal to adjacent insulating layers or the active layer. Further, the method used to form the transparent pixel electrode is a physical vapor deposition process, which is affected less by the processing environment.

The invention modifies the processing sequence of the TFT manufacturing method to prevent metallic ion diffusion to an adjacent insulating layer. The TFT manufacturing method comprises: forming a first metal layer on a substrate and performing an etching process to form a gate electrode of the TFT; and forming a transparent conducting electrode on the first metal layer and performing an etching process to form a pixel electrode. Subsequently, the method comprises: forming a dielectric layer; forming an amorphous silicon layer; forming an N+ amorphous silicon layer by plasma enhanced chemical vapor deposition and performing an etching process to define island and channel of the TFT; forming a second metal layer and performing an etching process to form a source and a drain of the TFT; and forming a passivation layer and performing an etching process to define a protective layer of the TFT.

The invention further provides a structure comprising: a first metal layer on a substrate, wherein the first metal layer after being etched forms a gate electrode of the TFT; a transparent conducting electrode on the first metal layer; a dielectric layer on the transparent conducting electrode, wherein the dielectric layer is an insulating layer; an amorphous silicon layer and N+ amorphous silicon layer on the dielectric layer, wherein the N+ amorphous silicon layer and amorphous silicon layer after being etched form a island and a channel of the TFT; and a second metal layer on the N+ amorphous silicon layer, wherein the second metal layer after being etched forms a source and a drain of the TFT.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

The invention provides a TFT electrode structure and its manufacturing process that can prevent metal diffusion, in particular copper metal diffusion, to an adjacent insulating layer during the manufacture of the TFT, so that current leakage and resulting poor conductivity problems can be improved.

In the TFT manufacturing process, the invention forms the pixel transparent electrode after the gate electrode metal so that the pixel transparent electrode can be used as a metallic ion barrier layer of the gate electrode metal. Due to its conduction property, the transparent electrode can prevent metallic ions from diffusing to the insulating layer and active layer at high temperature. Further, the conventional method uses an insulating layer formed by a high-temperature chemical vapor deposition method. In contrast, the pixel transparent electrode of the invention can be formed by a low-temperature physical vapor deposition method, which is affected less by the processing environment and is less sensitive to metallic ions effects.

FIG. 3A~3F are schematic views of a TFT manufacturing process according to an embodiment of the invention.

Figure 1A:
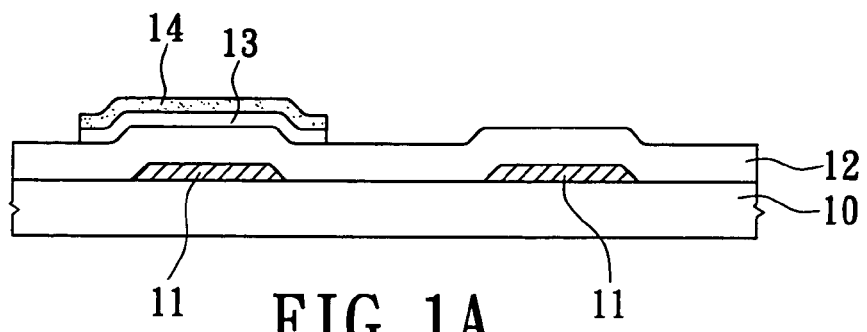
FIG. 1A~1E are schematic views showing a manufacturing method of a TFT with a multi-metal structure as disclosed in U.S. Pat. No. 6,218,221.
Figure 1B:
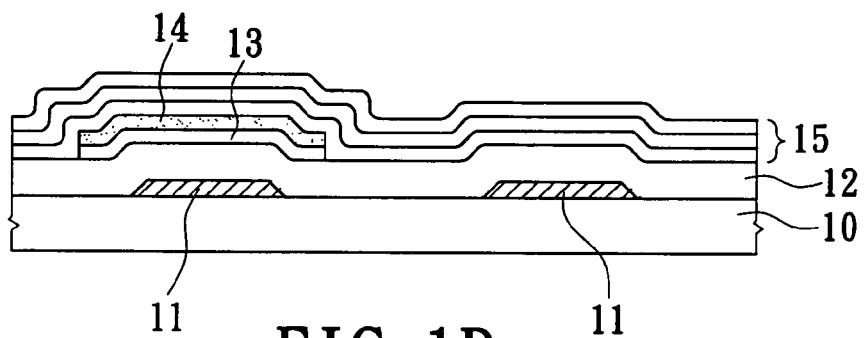
Figure 1C:
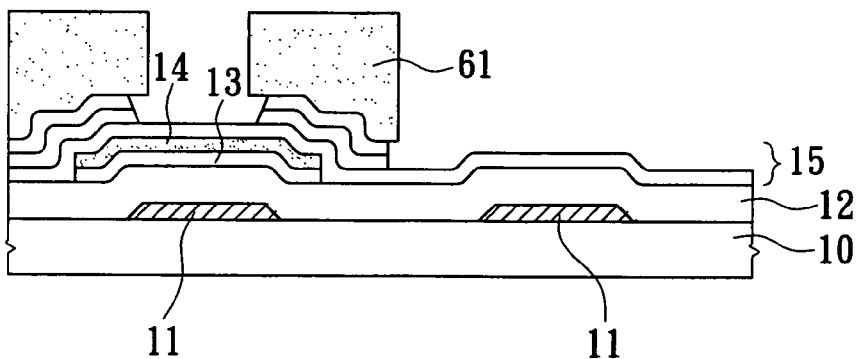
Figure 1D:
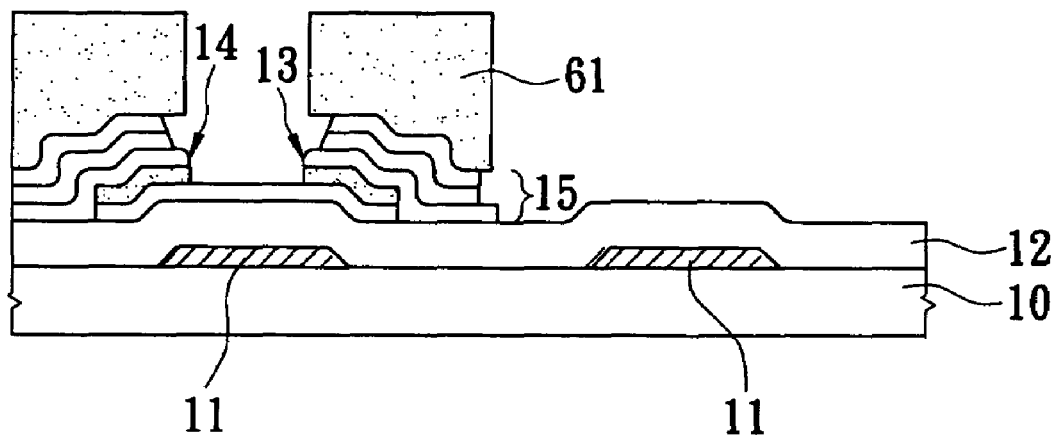
Figure 1E:
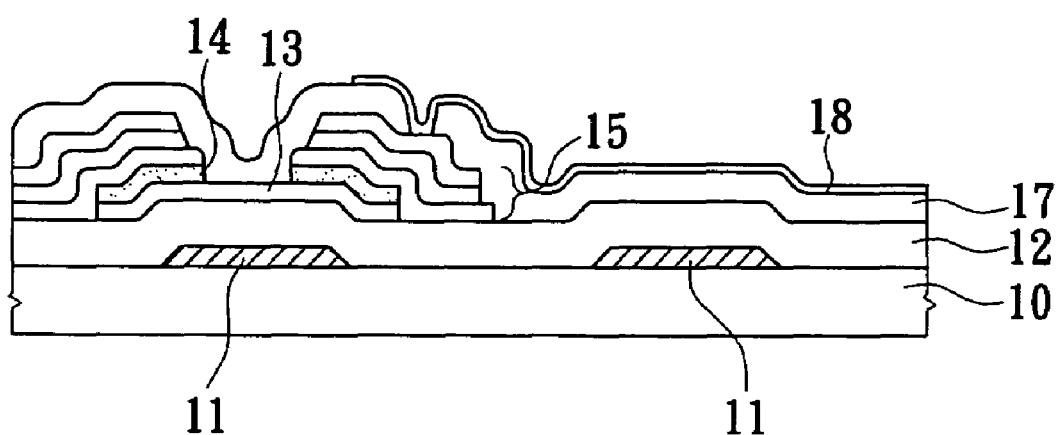
Figure 2A:
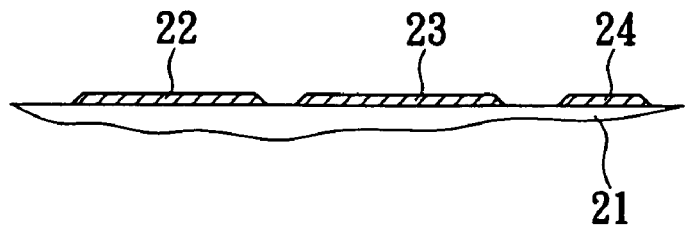
FIG. 2A~2E are schematic views showing a TFT array manufacturing method as disclosed in U.S. Pat. No. 5,838,037.
Figure 2B:
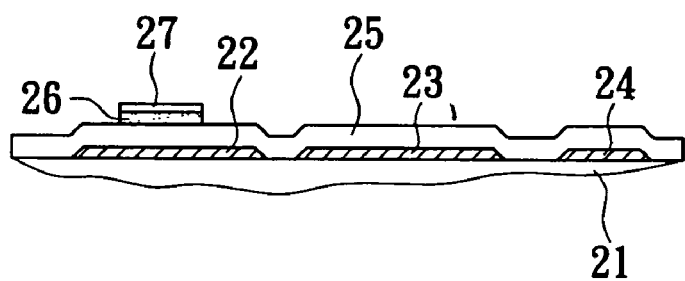
Figure 2C:
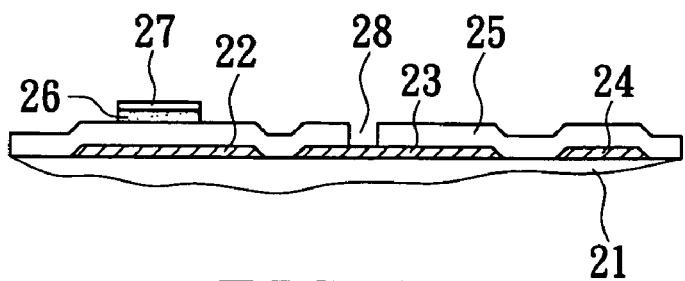
Figure 2D:
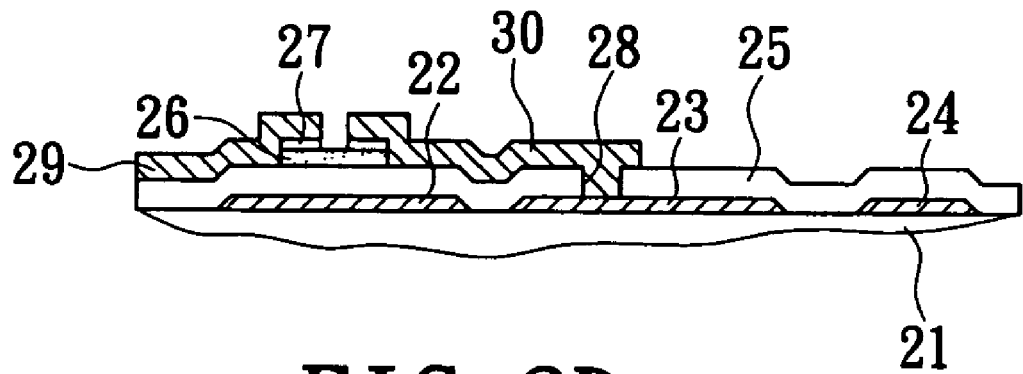
Figure 2E:
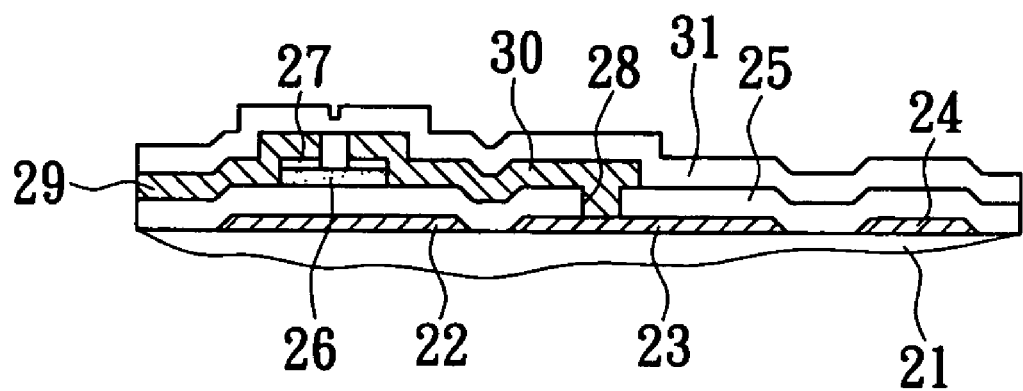
Figure 3A:
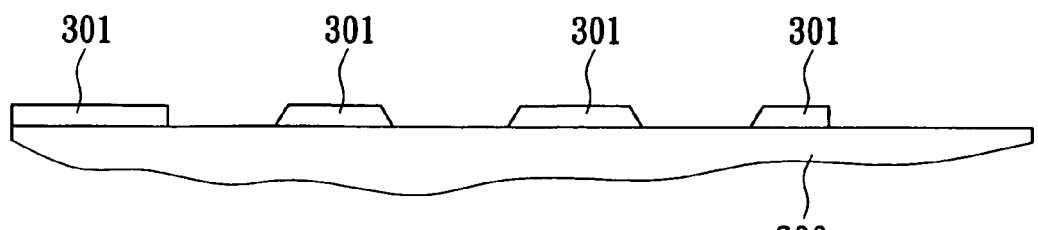
FIG. 3A~3F are schematic views showing a manufacturing method of a TFT electrode structure according to an embodiment of the invention.

As shown in FIG. 3A, a glass substrate 300 is used as transparent insulating substrate. A first metal layer 301, made of a single metal or metallic alloy composition, is deposited on the substrate 300. The first metal layer 301 then is etched to form a gate electrode of the TFT and peripheral protective circuit components. The application of these components can be TFT electrodes as illustrated in the Figure, but is not limited to the illustrated examples.

Figure 3B:
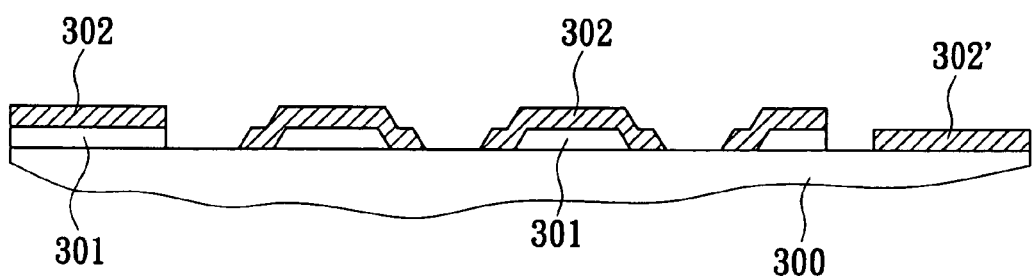

As shown in FIG. 3B, a transparent conducting electrode 302 is formed over the glass substrate 300 and the first metal layer 301. The transparent conducting electrode 302 can be formed by sputtering. The transparent conducting electrode is etched to form a pixel electrode of the TFT. This differs from the conventional method where the first metal layer is formed after the transparent conducting electrode. The formation of the transparent conducting electrode 302 covers the first metal layer 301. Metallic ion diffusion from the first metal layer 301 can be thereby blocked during subsequent high temperature processing steps, in particular when the first metal layer 301 is principally made of copper. Further, the transparent conducting electrode 302 after being etched can be used as a pixel electrode 302' of the TFT.

Figure 3C:
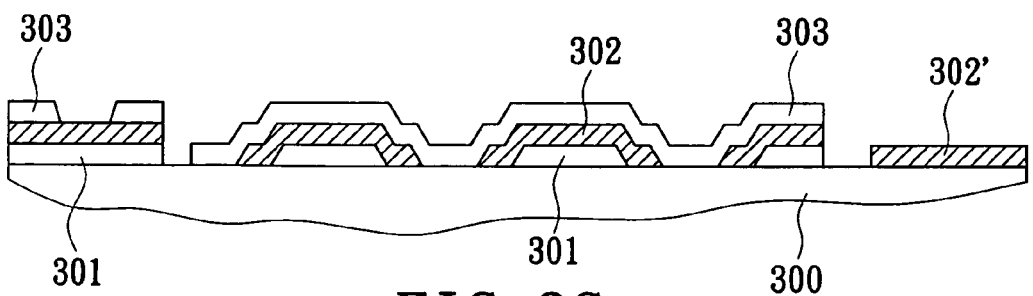

As shown in FIG. 3C, a dielectric layer 303 is formed on the transparent conducting electrode 302 and is used as insulating layer. The dielectric layer 303 can be silicon oxide, silicon nitride, or a multi-layer combination including silicon oxide and silicon nitride. The dielectric layer 303 can be formed by plasma enhanced chemical vapor deposition (PECVD). Since the first metal layer 301 is covered with the transparent conducting electrode 302, metallic ion diffusion can be blocked during this high-temperature process. As a result, current leakage and poor conductivity can be prevented.

Figure 3D:
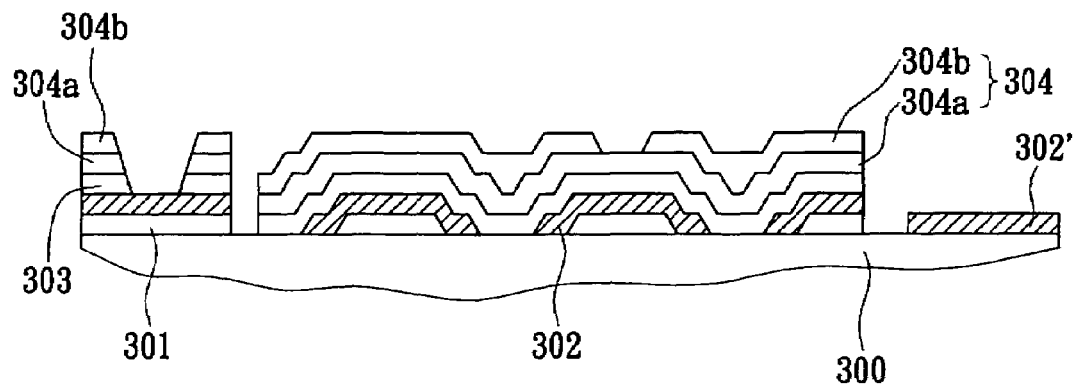

Referring to FIG. 3D, an amorphous silicon layer 304 is formed by plasma enhanced chemical vapor deposition. The amorphous silicon layer 304 can be a single or multi-layer structure. Subsequently, an N+ amorphous silicon layer is formed on the amorphous silicon layer 304 by PECVD. Alternatively, N+ ions can be implanted on the amorphous silicon layer 304 to form an amorphous silicon layer 304a and an N+ amorphous silicon layer 304b.

Figure 3E:
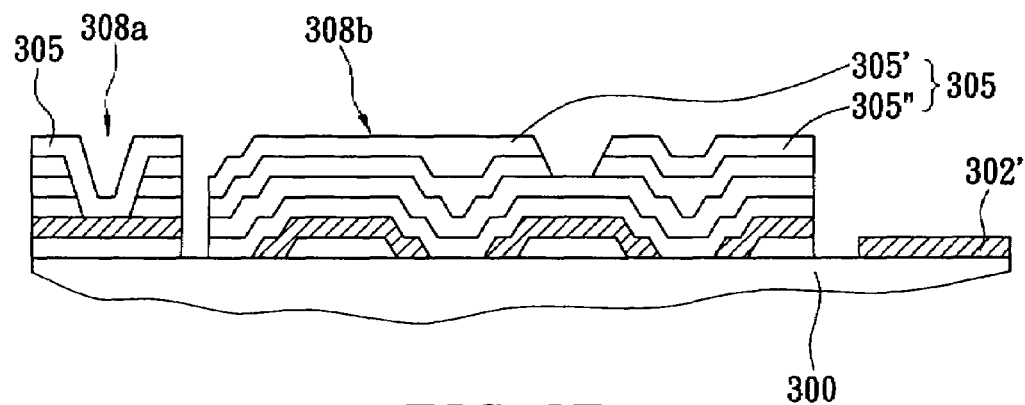

As shown in FIG. 3E, a second metal layer 305 is formed on the N+ amorphous silicon layer 304b. According to the demand, the N+ amorphous silicon layer 304b and the second metal layer 305 are etched to form the source and drain 305', 305" of the TFT and other element layers. The second metal layer 305 also can be unrestrictedly a multi-layer structure.

Figure 3F:
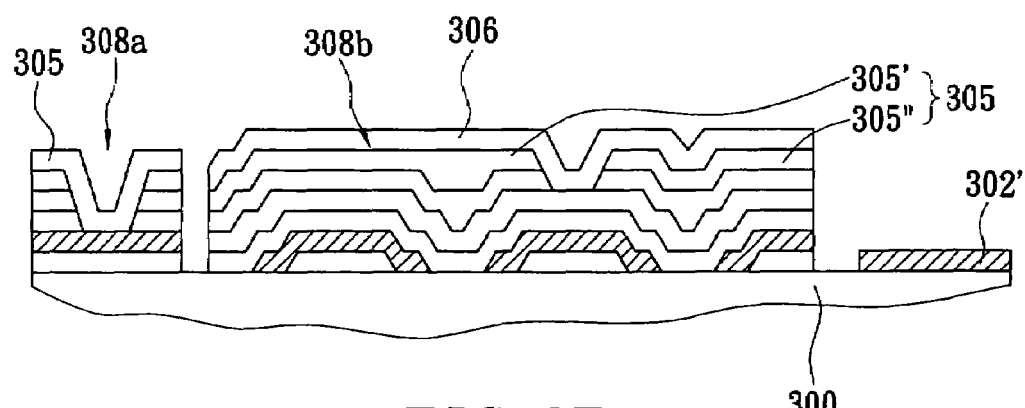

As shown in FIG. 3F, a passivation layer 306 is formed as a protective layer of the TFT. However, the passivation layer 306 is not necessarily needed to test the electrodes of the TFT. According to the need, a protective circuit 308a, the three electrodes structure 308b and the pixel electrode 302' can be further formed for the TFT.

Since the invention forms the pixel transparent electrode after the gate metal electrode to serve as a metallic ion barrier layer, metallic ion diffusion to the insulating layer and active layer under high temperature can be prevented. In addition, the PVD process implemented to form the layer is under low-temperature condition, which affects less by the processing environment. The pixel transparent electrode is conductive and not affected by the metallic ions. With the new process, the invention can reduce the risk of contamination of the CVD process due to metallic ions.

Figure 4:
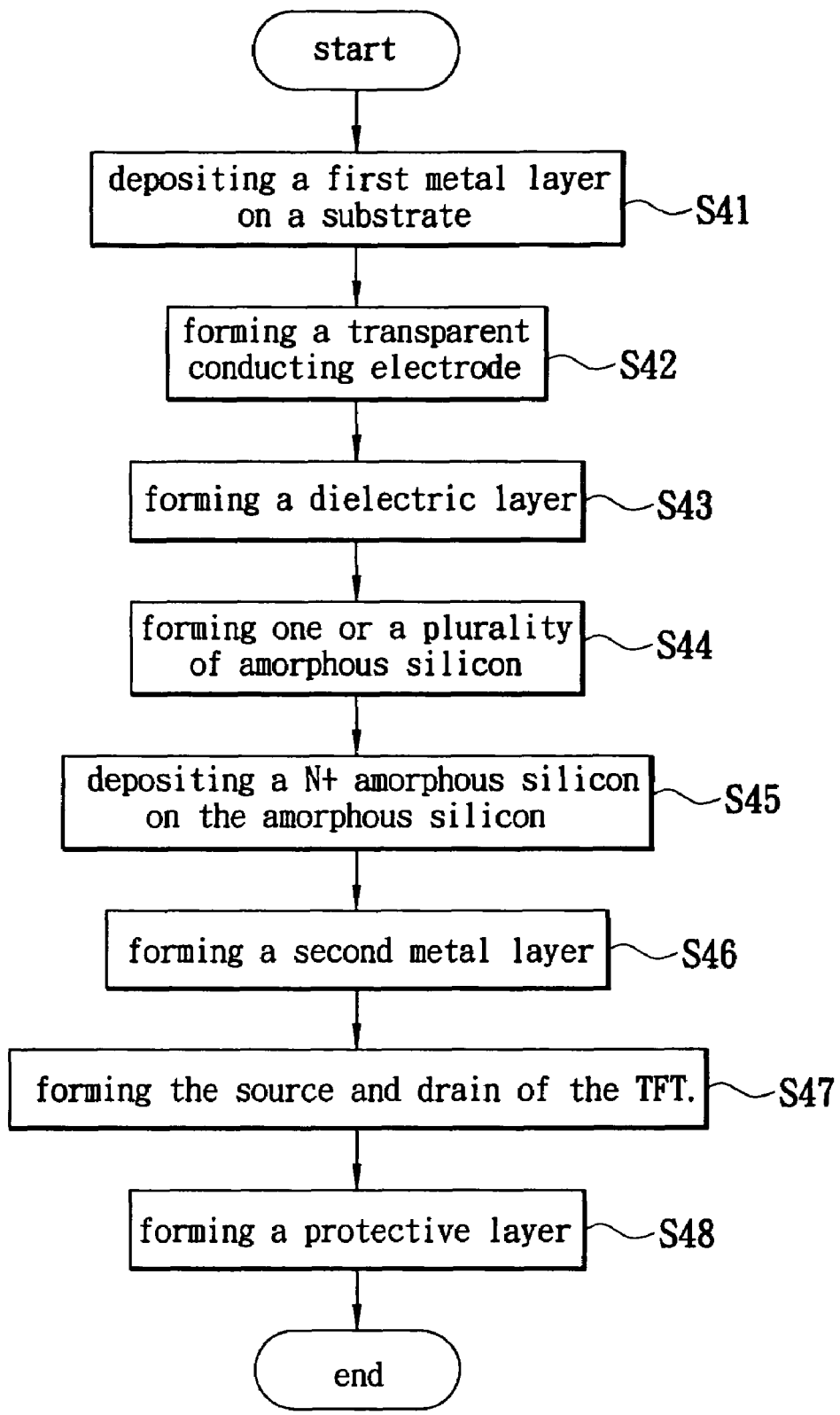
FIG. 4 is a flowchart of a manufacturing method of a TFT electrode capable of preventing metal diffusion according to an embodiment of the invention.

FIG. 4 is a flowchart of a manufacturing method of a TFT electrode that can prevent metallic ion diffusion according to an embodiment of the invention. In this embodiment, the TFT has a single electrode structure. However, this method can be applied to a TFT of multi-electrodes structure.

Step S41: a first metal layer is deposited on a substrate by PVD, electroplating, spin coating, printing or electroless plating; the first metal layer then is etched to form a gate electrode of the TFT.

In addition, the substrate surface includes glass, silicon nitride, silicon oxide, amorphous silicon, crystalline silicon, doped silicon, metal layers, metal nitride, metal silicide, polymer, or organic materials. The metal layers can be of a single or multi-layer structure. A single metal layer can include Cr, Cu, Al—Nd, MoW, or Al. A multi-metal structure can include Ti/Al/Ti, Ti/Al/TiN, Ti/Cu/Ti, Cr/Cu/Cr, W/Cu/W, MoN/Al/

MoN, Mo/Al—Nd, MoN/Al—Nd, Mo/Al—Nd/Mo, Ta/Cu/Ta, TaN/Cu/TaN, TiN/Cu/TiN, Ti/Al, Mo/Cu/Mo, or Mo/Al/Mo.

Step S42: a transparent conducting electrode is formed by deposition, such as: indium tin oxide, indium zinc oxide, zinc oxide or organic materials. The depositing method can include PVD, electroplating, spin coating, printing, or electroless plating. The transparent conducting electrode then is etched to form a pixel electrode.

The following is the conventional TFT manufacturing method:

Step S43: a dielectric layer is formed as insulating layer, including silicon dioxide or silicon nitride.

Step S44: one or a plurality of amorphous silicon is formed on the dielectric layer to improve the property of the TFT.

Step S45: an N+ amorphous silicon is deposited on the amorphous silicon by PECVD; alternatively, N+ ions are implanted in the amorphous silicon to form a doped N+ amorphous silicon layer.

Step S46: a second metal layer is formed on the N+ amorphous silicon layer.

Step S47: an etching is performed to form the source and drain of the TFT.

Step S48: a passivation layer is formed as protective layer of the TFT.

As described above, the invention therefore provides a TFT electrode structure and its manufacturing process that can prevent metal diffusion to an adjacent insulating layer during the manufacture of the TFT, so that the poor electrical properties such as leakage current and threshold voltage shifting problems can be improved.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A manufacturing method for a TFT electrode which is implemented to prevent metal ion diffusion to an adjacent insulating layer during fabrication, the method comprising, in the order recited:
   a. providing a substrate;
   b. forming a first metal layer on the substrate which is comprised of one of a single metal layer structure comprising of one of Cr, Cu, Al—Nd, Mo, MoW or Al, or a multiple metal layer structure comprising of one of Ti/Al/Ti, Ti/Al—Nd /Ti, Ti/Al/TiN, Ti/Al—Nd/TiN, Ti/Cu/Ti, Cr/Cu/Cr, W/Cu/W, MoN/Al/MoN, Mo/Al—Nd, MoN/Al—Nd, Mo/Al—Nd/Mo, Ta/Cu/Ta, TaN/Cu/TaN, TiN/Cu/TiN, Ti/Al, Mo/Cu/Mo, or Mo/Al/Mo;
   c. performing an etching process on the first metal layer to form a gate electrode of the TFT electrode;
   d. forming a transparent conducting electrode on the first metal layer to cover at least the gate electrode and prevent metal ion diffusion during fabrication, the transparent conducting electrode being comprised of one of indium tin oxide, indium zinc oxide, ZnO or an organic material;
   e. forming a pixel electrode which functions as a barrier to prevent metal ion diffusion during fabrication by performing another etching process on the transparent conducting electrode; and
   f. forming a dielectric layer on the transparent conducting electrode to cover the transparent conducting electrode;
   g. forming an amorphous silicon layer on the transparent conducting electrode;
   h. forming an N+ amorphous silicon layer on or within the amorphous silicon layer;
   i. forming a second metal layer on the N+ amorphous silicon layer, and performing another etching process to form a source and a drain of the TFT electrode; and
   j. forming a passivation layer on the second metal layer, and performing another etching process to define a protective layer of the TFT electrode over at least the source and drain.

2. The method of claim 1, wherein the TFT electrode has a single or multi-layer structure.

3. The method of claim 1, wherein forming the first metal layer includes at least one of performing a physical vapor deposition, electroplating, spin coating, printing, or electroless plating.

4. The method of claim 1, wherein the substrate is comprised of one of glass, silicon nitride, silicon oxide, amorphous silicon, crystalline silicon, doped silicon, metal layers, metal nitride, metal silicide, polymer, or organic materials.

5. The method of claim 1, wherein forming the transparent conducting electrode includes at least one of performing a physical vapor deposition, electroplating, spin coating, printing, or electroless plating.

6. A manufacturing method for a TFT electrode which is implemented to prevent metal ion diffusion to an adjacent insulating layer during fabrication, comprising, in the order recited:
   providing a substrate;
   forming a first metal layer on the substrate which is comprised of one of a single metal layer structure comprising of one of Cr, Cu, Al—Nd, Mo, MoW or Al, or a multiple metal layer structure comprising of one of Ti/Al/Ti, Ti/Al—Nd/Ti, Ti/Al/TiN, Ti/Al—Nd/TiN, Ti/Cu/Ti, Cr/Cu/Cr, W/Cu/W, MoN/Al/MoN, Mg/Al—Nd, MoN/Al—Nd, Mo/Al—Nd/Mo, Ta/Cu/Ta, TaN/Cu/TaN, TiN/Cu/TiN, Ti/Al, Mo/Cu/Mo, or Mo/Al/Mo;
   performing an etching process on the first metal layer to form a gate electrode of the TFT electrode;
   forming a transparent conducting electrode on the first metal layer to cover at least the gate electrode and prevent metal ion diffusion during fabrication, the transparent conducting electrode being comprised of one of indium tin oxide, indium zinc oxide, ZnO or an organic material;
   forming a pixel electrode which functions as a barrier to prevent metal ion diffusion during fabrication by performing another etching process on the transparent conducting electrode;
   forming a dielectric layer on the transparent conducting electrode to cover the transparent conducting electrode;
   forming an amorphous silicon layer on the transparent conducting electrode;
   forming a N+ amorphous silicon layer on or within the amorphous silicon layer;
   forming a second metal layer on the N+ amorphous silicon layer, and performing another etching process to form a source and a drain of the TFT electrode; and
   forming a passivation layer on the second metal layer, and defining a protective layer of the TFT electrode over at least the source and drain;

wherein the TFT electrode has a single or multi-layer structure;

wherein forming the first metal layer includes at least one of performing a physical vapor deposition, electroplating, spin coating, printing, or electroless plating;

wherein the substrate is comprised of one of glass, silicon nitride, silicon oxide, amorphous silicon, crystalline silicon, doped silicon, metal layers, metal nitride, metal silicide, polymer, or organic materials; and wherein forming the transparent conducting electrode includes at least one of performing a physical vapor deposition, electroplating, spin coating, printing, or electroless plating.

* * * * *